(12) United States Patent
Park et al.

(10) Patent No.: US 8,030,104 B2
(45) Date of Patent: Oct. 4, 2011

(54) METHOD FOR MANUFACTURING LIQUID CRYSTAL DISPLAY DEVICE

(75) Inventors: Sung Il Park, Daegu-si (KR); Dae Lim Park, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 463 days.

(21) Appl. No.: 12/222,997

(22) Filed: Aug. 21, 2008

(65) Prior Publication Data

US 2009/0081820 A1 Mar. 26, 2009

(30) Foreign Application Priority Data

Sep. 20, 2007 (KR) .................. 10-2007-0095939

(51) Int. Cl.
*G01R 31/26* (2006.01)
*H01L 21/66* (2006.01)

(52) U.S. Cl. ....... 438/29; 438/27; 438/42; 257/E21.533; 257/E21.535

(58) Field of Classification Search .................... 438/27, 438/30, 34, 29, 42; 349/139, 152; 257/E21.533, 257/E21.535

See application file for complete search history.

(56) References Cited

U.S. PATENT DOCUMENTS

2003/0123009 A1* 7/2003 Jo et al. .................... 349/141
2004/0125327 A1* 7/2004 Choi et al. ................. 349/187

* cited by examiner

*Primary Examiner* — Matthew Smith
*Assistant Examiner* — Quovaunda V Jefferson
(74) *Attorney, Agent, or Firm* — Morgan, Lewis & Bockius LLP

(57) ABSTRACT

A method for manufacturing a liquid crystal display device is disclosed. The method includes forming a gate electrode, a gate pad, a gate line on a substrate by using a first mask; forming a gate insulating film, an active layer, an ohmic contact layer and a conductive layer in sequence above the substrate including the gate electrode, the gate line and the gate pad; forming an active pattern, an ohmic contact pattern, source/drain electrodes, a data line and a data pad by using a second mask; forming a pixel electrode on the gate insulating film in a pixel region by using a third mask, to contact with the drain electrode; exposing the active pattern by etching the ohmic contact pattern using the source/drain electrodes as an etching mask; forming a passivation film above the substrate including the source/drain electrodes, the data line and the data pad; forming a first contact hole for exposing the gate pad and a second contact hole for exposing the data pad by etching the passivation and/or gate insulating films using a fourth mask; and forming a common electrode having a plurality of holes on the substrate by using a fifth mask.

4 Claims, 5 Drawing Sheets

METHOD FOR MANUFACTURING LIQUID CRYSTAL DISPLAY DEVICE

This application claims the benefit of Korean Patent Application No. 10-2007-95939, filed on Sep. 20, 2007, which is hereby incorporated by reference as if fully set forth herein.

BACKGROUND OF THE INVENTION

1. Field of the Invention

The present invention relates to a method for manufacturing a liquid crystal display device, and more particularly, to a method for manufacturing a fringe field switching mode liquid crystal display device.

2. Discussion of the Related Art

In order to improve a low aperture ratio and a low transmittance of a common IPS mode liquid crystal display device, a fringe field switching mode liquid crystal display device, which is a liquid crystal display device having a high aperture ratio and a high transmittance, has been devised.

FIG. 1 is a sectional view schematically illustrating a lower substrate of a conventional fringe field switching mode liquid crystal display device.

A lower substrate of a conventional fringe field switching mode liquid crystal display device, as shown in FIG. 1, includes a thin film transistor (TFT, not shown) having a gate electrode, a semiconductor layer, a source electrode and a drain electrode, which are formed on an insulating substrate 1, a transparent pixel electrode 3 connected to the drain electrode (not shown) of the TFT, a passivation film 5 formed on the TFT and the pixel electrode 3, and a transparent common electrode 7 formed on the passivation film 5 so as to be overlapped with the pixel electrode 3.

An upper substrate (not shown) is mounted at a predetermined gap from the lower substrate 1 while opposing the lower substrate 1. A liquid crystal layer (not shown) is interposed between the upper substrate (not shown) and the lower substrate 1. Because a so-called cell gap, which is a gap between the lower substrate 1 and the upper substrate (not shown), is formed to be larger than a gap between the common electrode 7 and the pixel electrode 3, a fringe field of a parabolic shape is formed between the common electrode 7 and the pixel electrode 3.

However, when the above-described conventional fringe field switching mode liquid crystal display device is manufactured, six mask processes for forming the TFT (which includes a mask process for forming the gate electrode, a mask process for forming the semiconductor layer, a mask process for forming the source/drain electrodes, a mask process for patterning the passivation film, a mask process for forming the common electrode, and a mask process for forming the pixel electrode) should be performed. In this regard, a new method for manufacturing a fringe field switching mode liquid crystal display device, which can reduce mask processes, is being required to be developed.

SUMMARY OF THE INVENTION

Accordingly, the present invention is directed to a method for manufacturing a liquid crystal display device that substantially obviates one or more problems due to limitations and disadvantages of the related art.

An object of the present invention is to provide a method for manufacturing a liquid crystal display device, which can reduce mask processes.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve the object and other advantages and in accordance with the purpose of the invention, as embodied and broadly described herein, a method for manufacturing a liquid crystal display device comprises: forming a gate electrode, a gate pad, a gate line on a substrate by using a first mask; forming a gate insulating film, an active layer, an ohmic contact layer and a conductive layer in sequence above the substrate including the gate electrode, the gate line and the gate pad; forming an active pattern, an ohmic contact pattern, source/drain electrodes, a data line and a data pad through by using a second mask; forming a pixel electrode on the gate insulting film by using a third mask, to contact with the drain electrode; exposing the active pattern by etching the ohmic contact pattern, using the source/drain electrodes as an etching mask; forming a passivation film on the substrate including the source/drain electrodes, the data line and the data pad; forming a first contact hole for exposing the gate pad and a second-contact hole for exposing the data pad by etching the passivation and/or gate insulating films using a fourth mask; and forming a common electrode having a plurality of holes on the substrate by using a fifth mask.

The step of forming the active pattern, the ohmic contact pattern, the source/drain electrodes, the data line and the data pad by using the second mask may include: forming a photoresist on the conductive layer, and performing a photolithography process using the second mask, which is configured as a diffraction exposure mask, to form a first photoresist pattern, the first photoresist pattern having a first portion positioned at a region corresponding to the gate electrode and a second portion positioned at a region corresponding to a region in which the source/drain electrodes are to be formed, and the first portion of the first photoresist pattern having a first thickness and the second portion of the first photoresist pattern having a second thickness larger than the first thickness; forming the active pattern, the ohmic contact pattern, a conductive pattern, the data line and the data pad by performing an etching process using the first photoresist pattern as an etching mask; forming a second photoresist pattern by ashing the first portion of the first photoresist pattern having the first thickness so that the conductive pattern is exposed; and forming the source/drain electrodes by patterning the conductive pattern, using the second photoresist pattern as an etching mask.

The common electrode may be formed to cover a plurality of pixel regions defined by the data line and the gate line, and a plurality of holes of the common electrode may be only formed on a region in which the pixel electrode is formed.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention associated with a method for manufacturing a liquid crystal display device, examples of which are illustrated in the accompanying drawings. Wherever possible, the same reference numbers will be used throughout the drawings to refer to the same or like parts.

Figure 1:
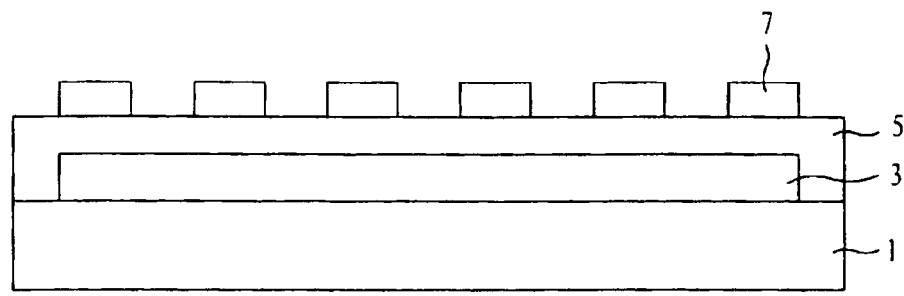
FIG. 1 is a sectional view schematically illustrating a lower substrate of a conventional fringe field switching mode liquid crystal display device.
Figure 2A:
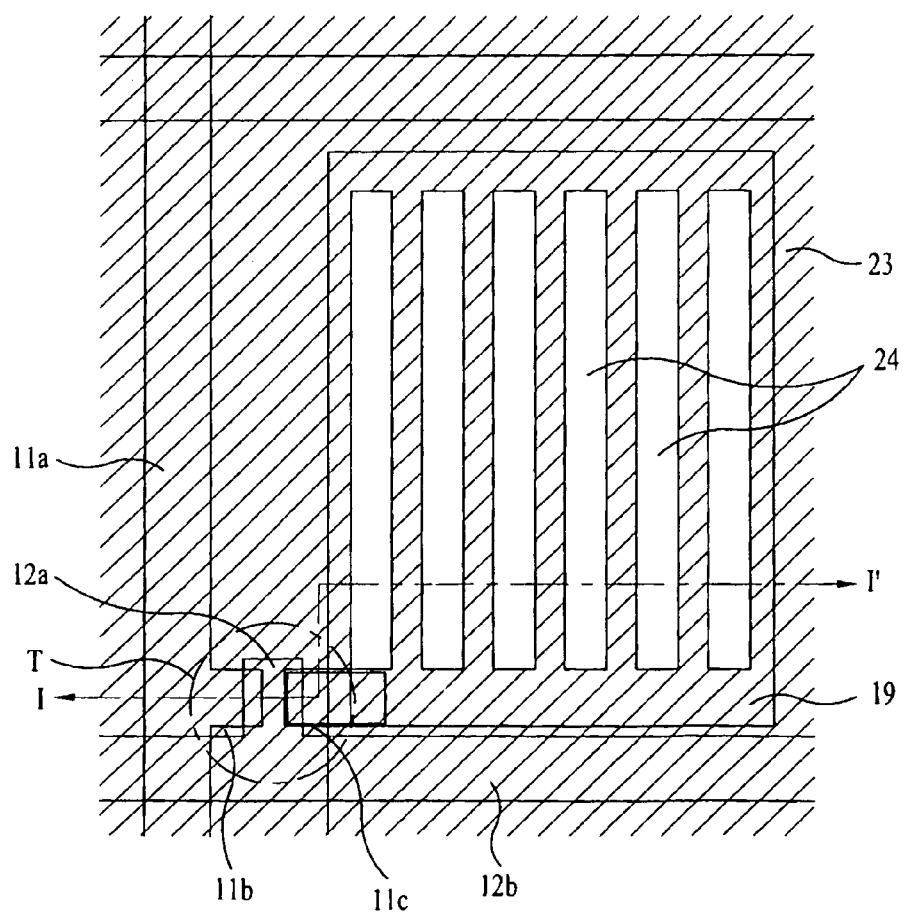
FIG. 2A is a plan view illustrating a fringe field switching mode liquid crystal display device according to an exemplary embodiment of the present invention.
Figure 2B:
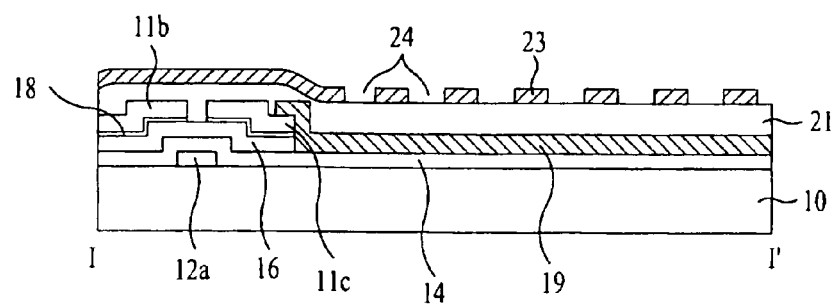
FIG. 2B is a sectional view taken along line I-I' in FIG. 2A.

FIG. 2A is a plan view illustrating a fringe field switching mode liquid crystal display device according to an exemplary embodiment of the present invention, and FIG. 2B is a sectional view taken along line I-I' in FIG. 2A.

As shown in FIGS. 2A and 2B, a substrate is constituted such that a gate line 12b and a data line 11a cross each other. A thin film transistor T, which is a switching element, is disposed at a crossing point of the gate line 12b and the data line 11a. A gate insulating film 14 is formed between the gate line 12b and the data line 11a.

The thin film transistor T includes a gate electrode 12a branched from the gate line 12b, an active pattern 16 and an ohmic contact pattern 18, which are channel layers of the thin film transistor overlapped with the gate electrode 12a, a source electrode 11b formed on the active pattern 16 and the ohmic contact pattern 18 and branched from the data line 11a, and a drain electrode 11c opposing the source electrode 11b.

A pixel electrode 19 of a plate shape is formed on a pixel region which is defined by the gate line 12b and the data line 11a crossing each other. The pixel electrode 19 is overlapped with the drain electrode 11c without a contact hole penetrating a passivation film, and is directly contacted with the drain electrode 11c.

The passivation film 21 is formed on the thin film transistor T and the pixel electrode 19.

A common electrode 23 is formed on the passivation film 21. The common electrode 23 is formed to cover a plurality of pixel regions defined on a lower substrate 10, on which the thin film transistors T are formed in array. Also, the common electrode 23 is formed with a plurality of holes 24 in the region overlapped with the pixel electrode 19.

The pixel electrode 19 and the common electrode 23 are made of indium tin oxide (ITO), which is a transparent material. Because the passivation film 21 is interposed between the pixel electrode 19 and the common electrode 23, a gap between pixel electrode 19 and the common electrode 23 is formed to be smaller than a cell gap, i.e., a gap between the upper substrate and the lower substrate. Accordingly, a fringe field of a parabolic shape is formed on the electrodes 19 and 23.

Hereinafter, a method for manufacturing the above-described fringe field switching mode liquid crystal display device will be explained with reference to FIGS. 3A to 3H.

FIGS. 3A to 3H are sectional views taken along line I-I' in FIG. 2A, which are disclosed according to a process flow of the present invention. Further, FIGS. 3A to 3H include sectional views of a gate pad and a data pad (although not illustrated in the plan view of FIG. 2A), which are disclosed according to a process flow of the present invention.

Figure 3A:
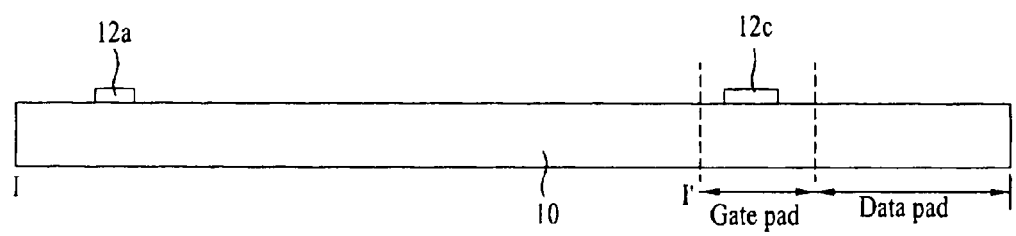
FIGS. 3A to 3H are sectional views explaining a method for manufacturing the fringe field switching mode liquid crystal display device according to an exemplary embodiment of the present invention.

As shown in FIG. 3A, a gate line (not shown), the gate electrode 12a and a gate pad 12c are formed on the insulating substrate 10. The gate line (not shown), the gate electrode 12a and the gate pad 12c are formed by forming a first conductive layer on the insulating substrate 10 through deposition, such as sputtering, and patterning the first conductive layer through a photolithography process using a first mask.

Figure 3B:
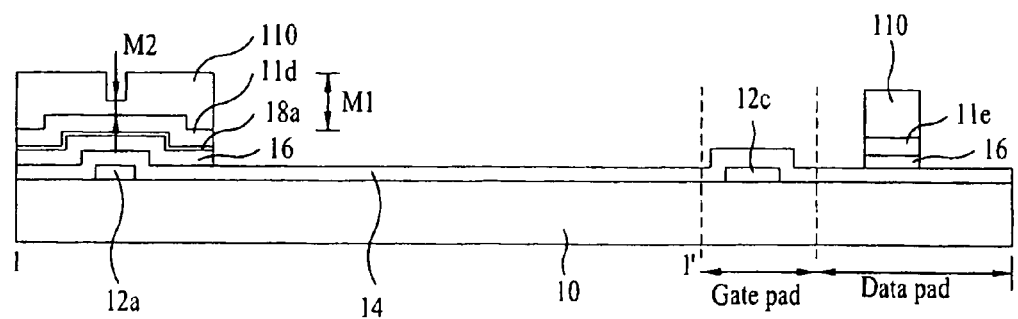

Subsequently, as shown in FIG. 3B, the gate insulating film 14, an active layer, an ohmic contact layer and a second conductive layer are sequentially formed on the insulating substrate 10 including the gate line, the gate electrode 12a and the gate pad 12c. A first photoresist pattern 110 is formed on the second conductive layer, and then the active layer, the ohmic contact layer and the second conductive layer are selectively etched by using the first photoresist pattern 110 as a mask, to form the active pattern 16, a first ohmic contact pattern 18a, a second conductive pattern 11d and a data pad 11e stacked on the active pattern 16. The first photoresist pattern 110 is formed through forming of a photoresist on the second conductive layer and a photolithography process using a second mask (not shown). The second mask (not shown) is configured as a diffraction exposure mask, which includes a light transmission region through which light totally passes, a diffraction exposure region having a plurality of slits to permit transmission of a portion of light and block another portion of light, and a light blocking region which totally blocks light. The diffraction exposure region is located at a position corresponding to a channel region of a thin film transistor, and the light blocking region is located on a region in which the source/drain electrodes are to be formed. Preferably, a thickness M2 of the first photoresist pattern formed on the diffraction exposure region is set to be smaller than a thickness M1 of the first photoresist pattern formed on the light blocking region. The films formed below the first photoresist pattern 110 are patterned, using the first photoresist pattern 110 as an etching mask, so as to form the active pattern 16, the first ohmic contact pattern 18a, the second conductive pattern 11d and the data pad 11e stacked on the active pattern 16 (ohmic contact pattern (not shown)).

Figure 3C:
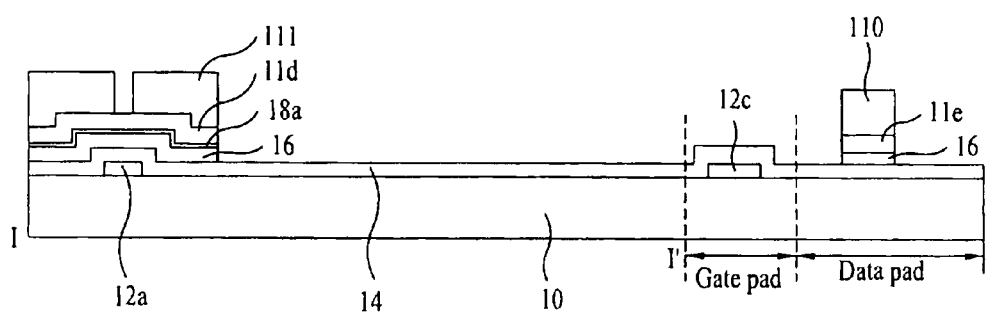

Thereafter, as shown in FIG. 3C, a second photoresist pattern 111 is formed above the insulating substrate 10. The second photoresist pattern 111 is formed by performing an ashing process to the first photoresist pattern 110 so that the second conductive pattern 11d corresponding to the channel region is exposed.

Figure 3D:
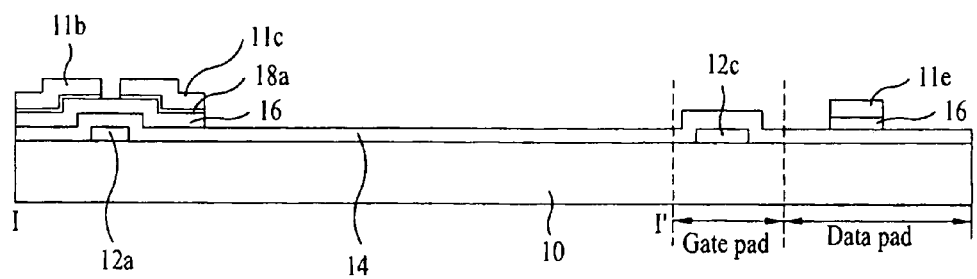

Then, as shown in FIG. 3D, the source/drain electrodes 11b and 11c and a data line (not shown) are formed above the insulating substrate 10. The source/drain electrodes 11b and 11c and the data line (not shown) are formed by patterning the second conductive pattern 11d, using the second photoresist pattern 111 as an etching mask. Thereafter, the second photoresist pattern 111 is removed.

Figure 3E:
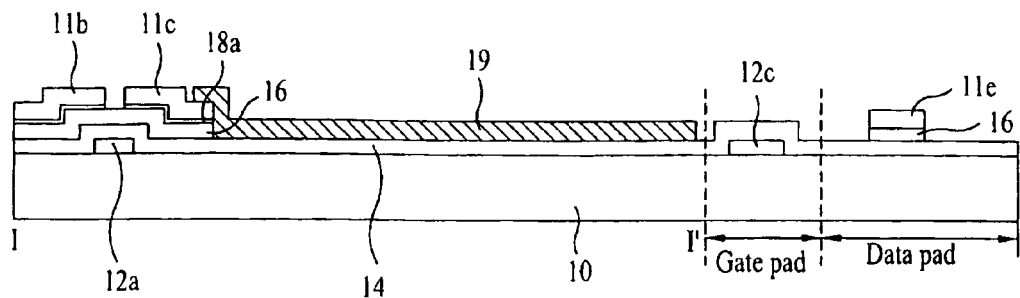

Next, as shown in FIG. 3E, the pixel electrode 19 is formed above the insulating substrate 10. The pixel electrode 19 is formed by forming a transparent material on a front surface of the insulating substrate 10 through deposition, such as sputtering, and patterning the transparent material through a photolithography process using a third mask. At this time, the pixel electrode 19 is overlapped with the drain electrode 11c, and is directly contacted with the drain electrode 11c.

Figure 3F:
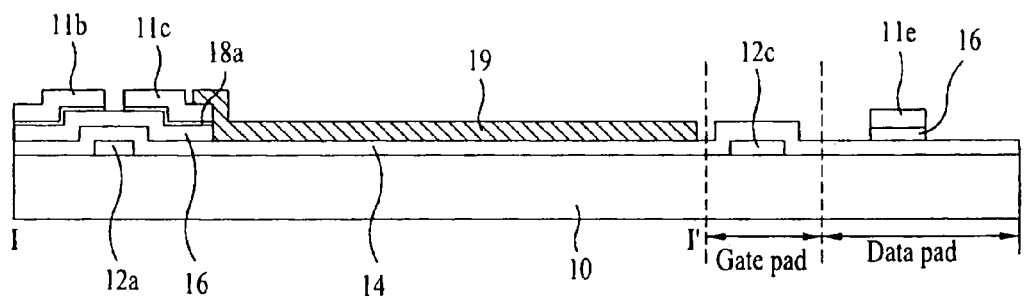

Subsequently, as shown in FIG. 3F, a second ohmic contact pattern 18 is formed above the insulating substrate 10, so as to form a channel on the active pattern 16.

The second ohmic contact pattern 18 is formed by dry etching the first ohmic contact pattern 18a, using the source/drain electrodes 11b and 11c as an etching mask, and thus a channel is formed on the active pattern 16 which is exposed by the formation of the second ohmic contact pattern 18. At this time, by carrying out the forming process of the second ohmic contact pattern 18 prior to a forming process of the passivation film 21 (refer to FIG. 3G), the active pattern 16 is protected from the processes following the forming process of the source/drain electrodes 11b and 11c. If the forming process of the second ohmic contact pattern 18 is carried out immediately after forming the source/drain electrodes 11b and 11c, the second photoresist pattern removing process and the pixel electrode deposition and patterning processes are carried out while the active pattern 16 is exposed, which may create membrane contamination of the active pattern 16 and as a result deterioration of properties of the thin film transistor. Accordingly, if the first ohmic contact pattern 18a is not etched immediately after the source/drain electrodes 11b and 11c are formed, and the second ohmic contact pattern 18 is formed after the second photoresist pattern removing process and the pixel electrode deposition and patterning processes are performed, the active pattern 16 is protected from the processes following the forming process of the source/drain electrodes 11b and 11c, thereby preventing membrane contamination of the active pattern 16 and deterioration of properties of the thin film transistor.

Figure 3G:
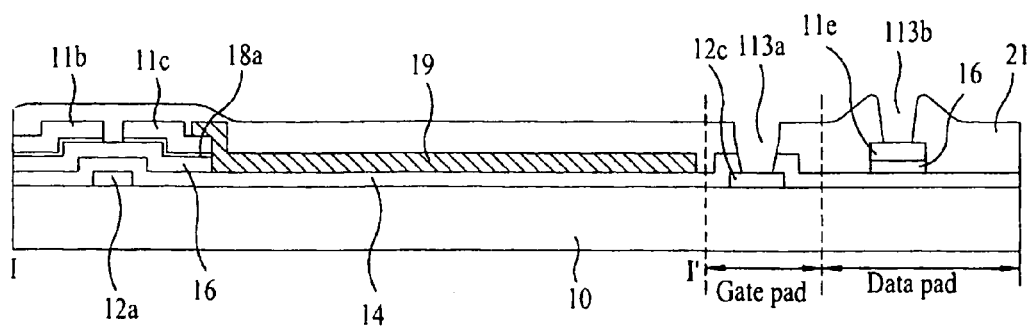

Next, as shown in FIG. 3G, the passivation film 21, which is a second insulating film formed with first and second contact holes 113a and 113b, is formed above the insulating substrate 10.

The passivation film 21 having the first and second contact holes 113a and 113b is formed by depositing a passivation film above the insulating substrate 10 and patterning the passivation film through a photolithography process using a fourth mask. At this time, the first contact hole 113a is formed by patterning the gate insulating film 14 and the passivation film 21 in order to expose the gate pad 12c, and the second contact hole 113b is formed by patterning the passivation film 21 in order to expose the data pad 11e.

Figure 3H:
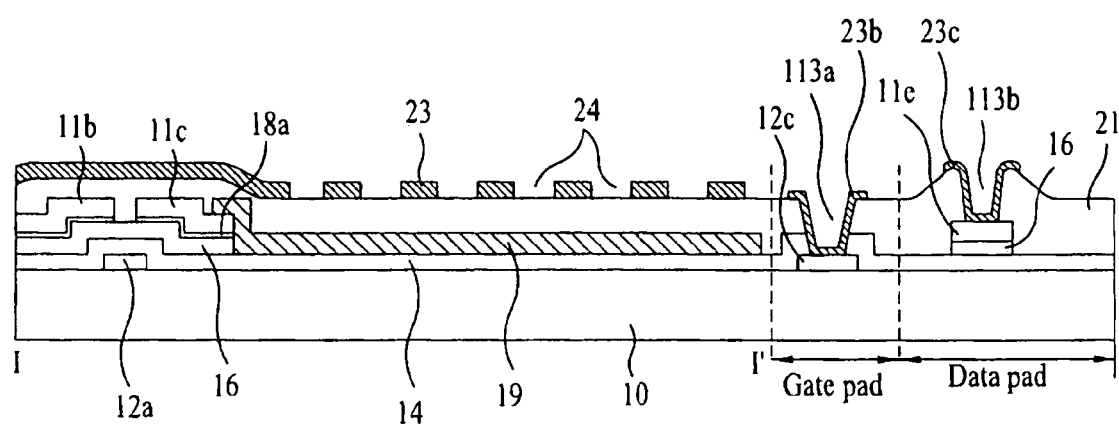

Thereafter, as shown in FIG. 3H, the common electrode 23 having a plurality of holes 24, a first transparent conductive layer 23b and a second transparent conductive layer 23c are formed above the insulating substrate 10.

The common electrode 23 having a plurality of holes 24, the first transparent conductive layer 23b and the second transparent conductive layer 23c are formed by depositing a conductive layer of a transparent material above the insulating substrate 10 formed with the passivation film 21 and patterning the conductive layer through a photolithography process using a fifth mask.

The first transparent conductive layer 23b is contacted with the gate pad 12c exposed through the first contact hole 113a, and the second transparent conductive layer 23c is contacted with the data pad 11e exposed through the second contact hole 113b.

The common electrode 23 is formed to cover a plurality of pixel regions defined on the lower substrate 10, and a plurality of holes 24 of the common electrode 23 are only formed on the region in which the pixel electrode 19 is formed.

By virtue of the common electrode 23 formed to cover a plurality of pixel regions, a signal flowing through the data line 11a does not have an influence on a horizontal electric field (i.e., an electric field formed between the pixel electrode and the common electrode). Accordingly, a liquid crystal display device of a high image quality, in which image smear does not occur, can be manufactured.

Different from the common electrode of the present invention, if the common electrode is patterned for each pixel region and an end of the common electrode is positioned at a border portion between the pixel regions, a signal flowing through the data line has an influence on a horizontal electric field. The liquid crystals positioned at a portion in which the horizontal electric field is distorted have arrangement features different from the liquid crystals positioned at a center portion of the pixel region. Thus, transmittance of light passing through the portion in which the horizontal electric field is distorted becomes different, which causes image smear. Accordingly, there occurs a problem of deterioration of image quality of the liquid crystal display device due to the image smear. However, the common electrode 23 of the present invention, which is formed to cover a plurality of pixel regions, prevents a signal flowing through the data line 11a from having an influence on the horizontal electric field. As a result, according to the present invention, the liquid crystal display device of a high image quality capable of preventing image smear can be manufactured.

As apparent from the above description, the method for manufacturing a liquid crystal display device according to the present invention can simplify a manufacturing process by carrying out the five mask processes, i.e., by eliminating one mask process from the conventional manufacturing method including six mask processes.

Further, since the second ohmic contact pattern is formed after the source/drain electrodes are formed and after the second photoresist pattern removing process and the pixel electrode deposition and patterning processes are carried out, the active pattern is protected from the processes following the forming process of the source/drain electrodes. Accordingly, membrane contamination of the active pattern is prevented, and as a result deterioration of properties of the thin film transistor can be prevented.

Still further, since the common electrode is formed to cover a plurality of pixel regions, a signal flowing through the data line does not have an influence on a horizontal electric field. Accordingly, the liquid crystal display device of a high image quality capable of preventing image smear can be manufactured.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing a liquid crystal display device, comprising:
    forming a gate electrode, a gate pad, a gate line on a substrate by using a first mask;
    forming a gate insulating film, an active layer, an ohmic contact layer and a conductive layer in sequence above the substrate including the gate electrode and the gate pad;
    forming an active pattern, an ohmic contact pattern, source/drain electrodes, a data line and a data pad by using a second mask;
    forming a pixel electrode on the gate insulating film in a pixel region by using a third mask to contact with the drain electrode;

exposing the active pattern by etching the ohmic contact pattern, using the source/drain electrodes as an etching mask;

forming a passivation film on the substrate including the source/drain electrodes, the data line and the data pad;

forming a first contact hole for exposing the gate pad and a second contact hole for exposing the data pad by etching the passivation and/or gate insulating films using a fourth mask;

forming a common electrode having a plurality of holes on the substrate by using a fifth mask; and wherein the plurality of holes of the common electrode are only formed on a region in which the pixel electrode is formed.

2. The method according to claim 1, wherein the step of forming the active pattern, the ohmic contact pattern, the source/drain electrodes, the data line and the data pad by using the second mask includes:

forming a photoresist on the conductive layer, and performing a photolithography process using the second mask, which is configured as a diffraction exposure mask, to form a first photoresist pattern, the first photoresist pattern having a first portion positioned at a region corresponding to the gate electrode and a second portion positioned at a region corresponding to a region in which the source/drain electrodes are to be formed, and the first portion of the first photoresist pattern having a first thickness and the second portion of the first photoresist pattern having a second thickness larger than the first thickness;

forming the active pattern, the ohmic contact pattern, a conductive pattern, the data line and the data pad by performing an etching process using the first photoresist pattern as an etching mask;

forming a second photoresist pattern by ashing the first portion of the first photoresist pattern having the first thickness so that the conductive pattern is exposed; and forming the source/drain electrodes by patterning the conductive pattern, using the second photoresist pattern as an etching mask.

3. The method according to claim 1, wherein the common electrode is formed to cover a plurality of pixel regions defined by the data line and the gate line.

4. The method according to claim 1, further comprising, forming a first transparent conductive layer to contact with the gate pad through the first contact hole, and a second transparent conductive layer to contact with the data pad through the second contact hole, when the common electrode is formed.

* * * * *